United States Patent
Uchida

(10) Patent No.: US 8,274,327 B2
(45) Date of Patent: Sep. 25, 2012

(54) SWITCHED CAPACITOR AMPLIFIER

(75) Inventor: Toshiyuki Uchida, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 13/039,860

(22) Filed: Mar. 3, 2011

(65) Prior Publication Data
US 2011/0215864 A1     Sep. 8, 2011

(30) Foreign Application Priority Data

Mar. 5, 2010   (JP) .................................. 2010-049873

(51) Int. Cl.
*H03F 1/02*   (2006.01)

(52) U.S. Cl. ............................... 330/9; 330/51; 330/109

(58) Field of Classification Search ................. 330/9, 51, 330/109
See application file for complete search history.

(56) References Cited

U.S. PATENT DOCUMENTS

| 4,543,534 A | 9/1985 | Temes et al. | |
|---|---|---|---|
| 4,555,668 A * | 11/1985 | Gregorian et al. | 330/9 |
| 4,806,874 A * | 2/1989 | Michel | 330/9 |
| 6,191,648 B1 * | 2/2001 | Lewicki | 327/554 |
| 6,194,946 B1 * | 2/2001 | Fowers | 327/337 |
| 6,778,121 B2 * | 8/2004 | Manganaro | 341/150 |
| 7,795,959 B2 * | 9/2010 | Chen et al. | 330/9 |
| 7,990,209 B2 * | 8/2011 | Romero | 327/556 |

* cited by examiner

*Primary Examiner* — Patricia Nguyen
(74) *Attorney, Agent, or Firm* — Brinks Hofer Gilson & Lione

(57) ABSTRACT

Provided is a switched capacitor amplifier capable of outputting a stable output voltage. The switched capacitor amplifier is capable of operating so as to eliminate a charge/discharge time difference between an input capacitor (18) and an output capacitor (19). Accordingly, in a shift from a hold state to a sample state, for example, even if one terminal voltage (V2) of the output capacitor (19) abruptly increases to an output voltage (VOUT), another terminal voltage (Vs) of the output capacitor (19) does not increase abruptly. In other words, an input voltage to an internal amplifier (11) does not increase abruptly. Therefore, an output voltage of the internal amplifier (11) becomes stable and accordingly the output voltage (VOUT) becomes stable as well.

3 Claims, 4 Drawing Sheets

SWITCHED CAPACITOR AMPLIFIER

RELATED APPLICATIONS

This application claims priority under 35 U.S.C. §119 to Japanese Patent Application No. 2010-049873 filed on Mar. 5, 2010, the entire content of which is hereby incorporated by reference.

BACKGROUND OF THE INVENTION

1. Field of the Invention

The present invention relates to a switched capacitor amplifier.

2. Description of the Related Art

A conventional switched capacitor amplifier is described. FIG. 3 is a circuit diagram illustrating the conventional switched capacitor amplifier. FIG. 4 is a time chart illustrating an operation of the conventional switched capacitor amplifier.

During sampling, a control circuit 60 controls a clock signal Φ1 to L. Accordingly, a switch 43 and switches 45 and 46 are turned OFF. The control circuit 60 controls a clock signal Φ2 to H. Accordingly, a switch 42, a switch 44, and a switch 47 are turned ON. Then, an input voltage VIN is input, and the input voltage VIN is sampled on a capacitor 48. The sampled input voltage VIN is amplified at a capacitance ratio between the capacitor 48 and a capacitor 49 having a smaller capacitance than the capacitor 48, and an internal amplifier 41 outputs an output voltage VOUT. Charges based on the output voltage VOUT are charged in a capacitor 50.

During holding, the control circuit 60 controls the clock signal Φ1 to H. Accordingly, the switch 43 and the switches 45 and 46 are turned ON. The control circuit 60 controls the clock signal Φ2 to L. Accordingly, the switch 42, the switch 44, and the switch 47 are turned OFF. In this case, there is no negative feedback path of the internal amplifier 41 via the capacitor 49, but a negative feedback path of the internal amplifier 41 via the capacitor 50 is formed. Therefore, based on the charges charged in the capacitor 50 during the sampling, a voltage based on the output voltage VOUT during the sampling is held.

The switched capacitor amplifier operates to repeat the sample state and the hold state alternately, and there is no migration of charges based on an offset voltage of the internal amplifier 41 between the sample state and the hold state. Therefore, the offset voltage of the internal amplifier 41 is less likely to affect the output voltage VOUT (see, for example, U.S. Pat. No. 4,543,534).

Here, in the shift from the hold state to the sample state, the input voltage VIN is lower than a reference voltage VREF, and the output voltage VOUT is higher than the reference voltage VREF. When the clock signal Φ2 becomes H to turn ON the switch 42 as in the above-mentioned sampling, a voltage V1 reduces from the reference voltage VREF to the input voltage VIN so that the capacitor 48 is discharged. Further, when the clock signal Φ2 becomes H to turn ON the switch 44, a voltage V2 abruptly increases from the reference voltage VREF to the output voltage VOUT so that the capacitor 49 is charged abruptly.

In this case, although the capacitor 48 has a larger capacitance than the capacitor 49, circuit design cannot be made to increase the size of the input switch 42 so as to deal with the magnitude of the capacitance of the capacitor 48 so that the influence of noise on the internal amplifier 41 may be reduced, and hence a discharge speed of the capacitor 48 is slower than a charge speed of the capacitor 49, resulting in a charge/discharge time difference between the capacitor 48 and the capacitor 49. Accordingly, in the shift from the hold state to the sample state, when a voltage V2 abruptly increases to the output voltage VOUT, a voltage Vs also increases abruptly because of capacitive coupling of the capacitor 49. Then, the voltage Vs at an inverting input terminal of the internal amplifier 41 increases abruptly, and hence the output voltage VOUT reduces abruptly as illustrated in FIG. 4. Therefore, the output voltage VOUT is unstable.

Note that, the output voltage VOUT is also unstable in the case where the input voltage VIN is higher than the reference voltage VREF and the output voltage VOUT is lower than the reference voltage VREF.

SUMMARY OF THE INVENTION

The present invention has been made to solve the above-mentioned problems, and provides a switched capacitor amplifier capable of outputting a stable output voltage.

In order to solve the above-mentioned problems, the present invention provides a switched capacitor amplifier including: an input capacitor; an input switch provided between an input terminal of the switched capacitor amplifier and the input capacitor; an output capacitor having a capacitance smaller than a capacitance of the input capacitor; an output switch provided between the output capacitor and an output terminal of the switched capacitor amplifier; an internal amplifier for amplifying an input voltage at a capacitance ratio between the input capacitor and the output capacitor, to output an output voltage; a storage capacitor for storing charges based on the output voltage; and a control circuit for controlling the input switch and the output switch so that the output switch is turned ON when a predetermined time period elapses since the input switch was turned ON during sampling.

According to the present invention, the switched capacitor amplifier is capable of operating so as to eliminate a charge/discharge time difference between the input capacitor and the output capacitor. Accordingly, in the shift from a hold state to a sample state, for example, even if one terminal voltage of the output capacitor abruptly increases to the output voltage of the switched capacitor amplifier, another terminal voltage of the output capacitor does not increase abruptly. In other words, the input voltage to the internal amplifier does not increase abruptly. Therefore, the output voltage of the internal amplifier becomes stable and accordingly the output voltage of the switched capacitor amplifier becomes stable as well.

DETAILED DESCRIPTION OF THE PREFERRED EMBODIMENT

Now, referring to the accompanying drawings, an embodiment of the present invention is described below.

Figure 1:
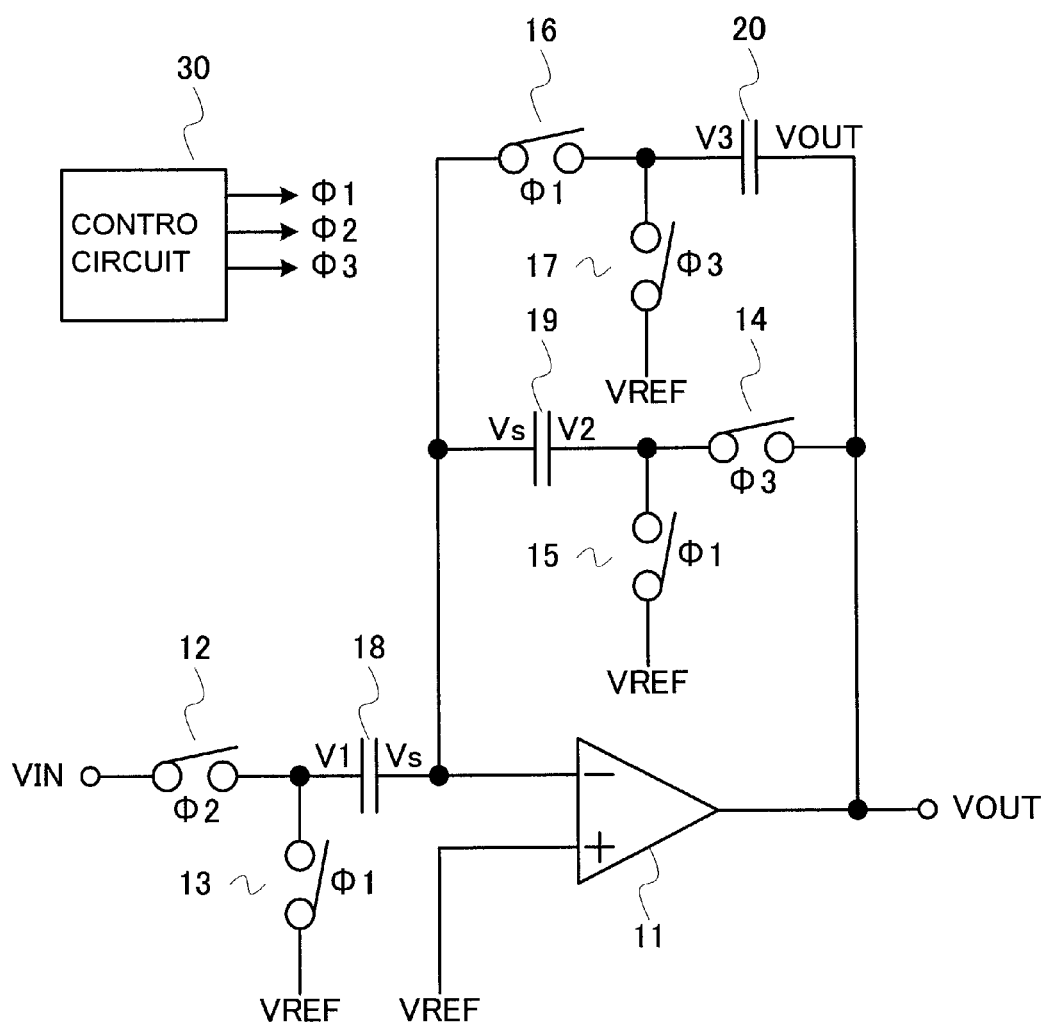
FIG. 1 is a circuit diagram illustrating a switched capacitor amplifier according to the present invention.

First, a configuration of a switched capacitor amplifier is described. FIG. 1 is a circuit diagram illustrating the switched capacitor amplifier.

The switched capacitor amplifier includes an internal amplifier 11, an input switch 12, a switch 13, an output switch 14, switches 15 to 17, an input capacitor 18, an output capacitor 19, a storage capacitor 20, and a control circuit 30.

The input switch 12 and the input capacitor 18 are provided in this order between an input terminal of the switched capacitor amplifier and an inverting input terminal of the internal amplifier 11. The switch 13 is provided between a connection point between the input switch 12 and the input capacitor 18, and a reference voltage input terminal of the switched capacitor amplifier. The switch 16 and the storage capacitor 20 are provided in this order between the inverting input terminal of the internal amplifier 11 and an output terminal of the internal amplifier 11. The switch 17 is provided between a connection point between the switch 16 and the storage capacitor 20, and the reference voltage input terminal of the switched capacitor amplifier. The output capacitor 19 and the output switch 14 are provided in this order between the inverting input terminal of the internal amplifier 11 and an output terminal of the internal amplifier 11. The switch 15 is provided between a connection point between the output capacitor 19 and the output switch 14, and the reference voltage input terminal of the switched capacitor amplifier. A non-inverting input terminal of the internal amplifier 11 is connected to the reference voltage input terminal of the switched capacitor amplifier, and an output terminal thereof is connected to an output terminal of the switched capacitor amplifier.

In the control circuit 30, a clock signal $\Phi 1$ of a first output terminal controls the switch 13 and the switches 15 and 16, a clock signal $\Phi 2$ of a second output terminal controls the input switch 12, and a clock signal $\Phi 3$ of a third output terminal controls the output switch 14 and the switch 17.

Figure 2:
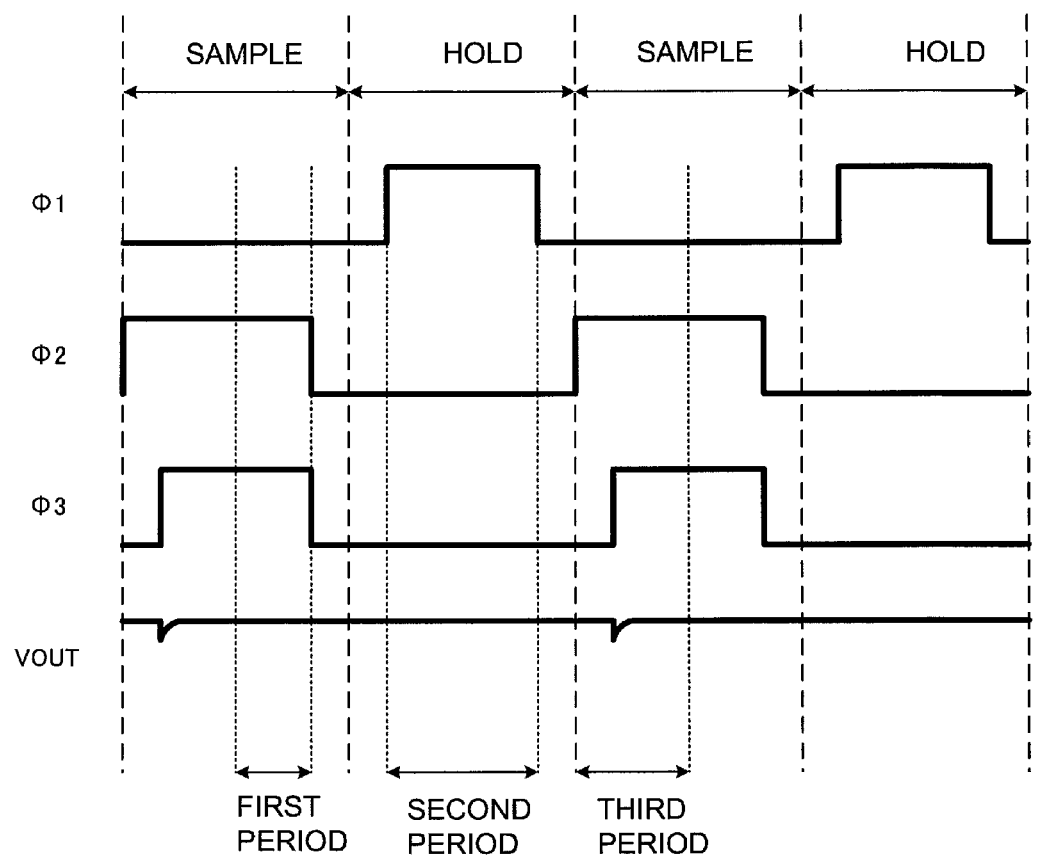
FIG. 2 is a time chart illustrating an operation of the switched capacitor amplifier according to the present invention.
Figure 3:
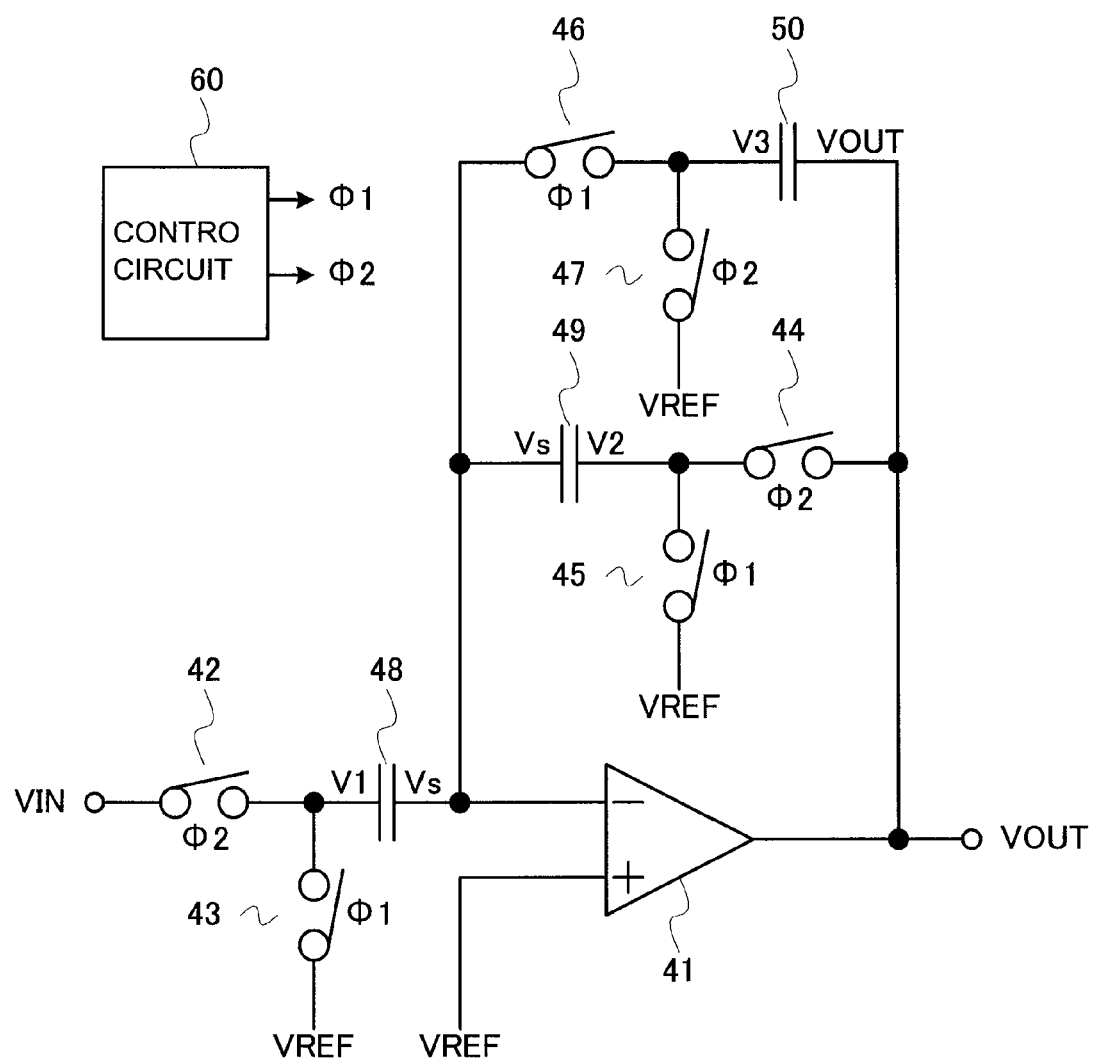
FIG. 3 is a circuit diagram illustrating a conventional switched capacitor amplifier.
Figure 4:
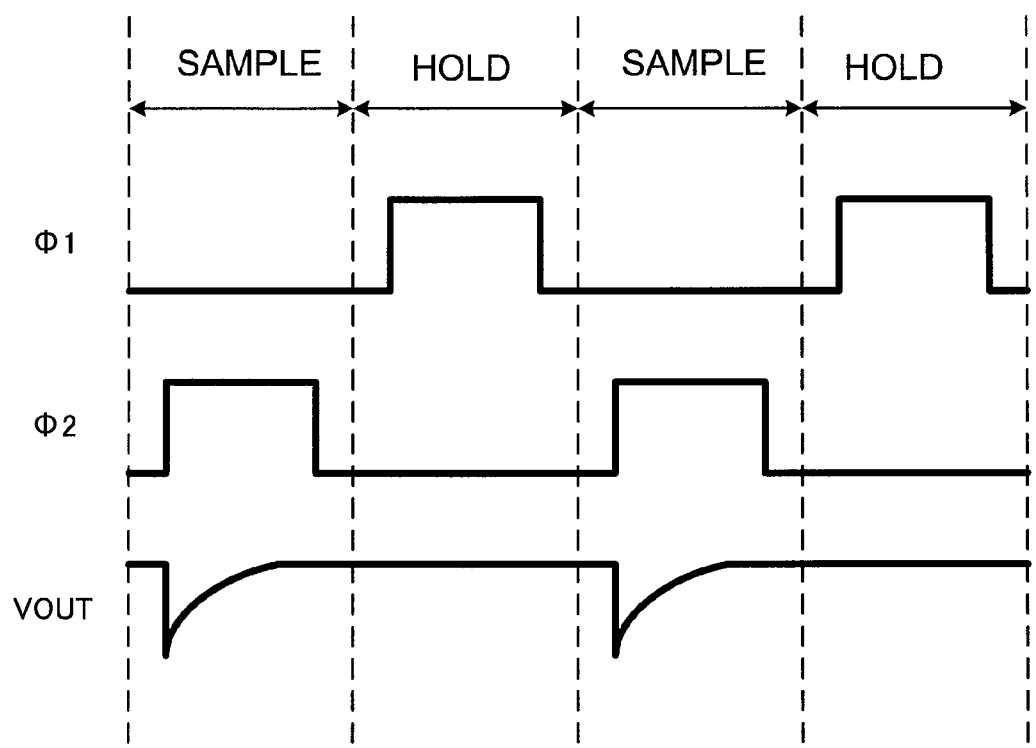
FIG. 4 is a time chart illustrating an operation of the conventional switched capacitor amplifier.

Next, an operation of the switched capacitor amplifier is described. FIG. 2 is a time chart illustrating the respective clock signals and an output voltage.

Here, a voltage at the input terminal of the switched capacitor amplifier is VIN, a voltage at the connection point between the input switch 12 and the input capacitor 18 is V1, a voltage at the inverting input terminal of the internal amplifier 11 is Vs, a voltage at the connection point between the output capacitor 19 and the output switch 14 is V2, a voltage at the connection point between the switch 16 and the storage capacitor 20 is V3, a voltage at the output terminal of the switched capacitor amplifier is VOUT, and a voltage at the reference voltage input terminal of the switched capacitor amplifier is VREF. Further, a capacitance of the input capacitor 18 is C18, a capacitance of the output capacitor 19 is C19, and a capacitance of the storage capacitor 20 is C20.

During a first period (sampling), the control circuit 30 controls the clock signal $\Phi 1$ to L. Accordingly, the switch 13 and the switches 15 and 16 are turned OFF. The control circuit 30 controls the clock signal $\Phi 2$ to H. Accordingly, the input switch 12 is turned ON. The control circuit 30 controls the clock signal $\Phi 3$ to H. Accordingly, the output switch 14 and the switch 17 are turned ON. Then, the input voltage VIN is input, and the input voltage VIN is sampled on the input capacitor 18. The sampled input voltage VIN is amplified at a capacitance ratio between the input capacitor 18 and the output capacitor 19 having a smaller capacitance than the input capacitor 18, and the internal amplifier 11 outputs the output voltage VOUT. Charges based on the output voltage VOUT are charged in the storage capacitor 20.

During a second period (holding), the control circuit 30 controls the clock signal $\Phi 1$ to H. Accordingly, the switch 13 and the switches 15 and 16 are turned ON. The control circuit 30 controls the clock signal $\Phi 2$ to L. Accordingly, the input switch 12 is turned OFF. The control circuit 30 controls the clock signal $\Phi 3$ to L. Accordingly, the output switch 14 and the switch 17 are turned OFF. In this case, there is no negative feedback path of the internal amplifier 11 via the output capacitor 19, but a negative feedback path of the internal amplifier 11 via the storage capacitor 20 is formed. Therefore, based on the charges charged in the capacitor 20 during the sampling, a voltage based on the output voltage VOUT during the sampling is held.

During a third period (sampling), in the shift from the hold state to the sample state, the input voltage VIN is lower than the reference voltage VREF, and the output voltage VOUT is higher than the reference voltage VREF. The control circuit 30 controls the clock signal $\Phi 1$ to L. Accordingly, the switch 13 and the switches 15 and 16 are turned OFF. The control circuit 30 controls the clock signal $\Phi 2$ to H. Accordingly, the input switch 12 is turned ON. Then, the voltage V1 reduces from the reference voltage VREF to the input voltage VIN so that the input capacitor 18 is discharged. After a predetermined time period elapses since the input switch 12 was turned ON during the sampling, the control circuit 30 controls the clock signal $\Phi 3$ to H. Accordingly, the output switch 14 and the switch 17 are turned ON. Then, the voltage V2 abruptly increases from the reference voltage VREF to the output voltage VOUT so that the output capacitor 19 is charged abruptly. In this case, although the capacitor 18 has a larger capacitance than the capacitor 19, circuit design cannot be made to increase the size of the input switch 12 so as to deal with the magnitude of the capacitance of the capacitor 18 so that the influence of noise on the internal amplifier 11 may be reduced, and hence a discharge speed of the input capacitor 18 is slower than a charge speed of the output capacitor 19. However, because the switch 14 is turned ON after the predetermined period has elapsed since the input switch 12 was turned ON, the discharge of the input capacitor 18 is started earlier than the charge of the output capacitor 19 by the predetermined period, and hence the switched capacitor amplifier is capable of operating so as to eliminate a charge/discharge time difference between the input capacitor 18 and the output capacitor 19.

Note that, also in the case where the input voltage VIN is higher than the reference voltage VREF and the output voltage VOUT is lower than the reference voltage VREF, the switched capacitor amplifier is capable of operating so as to eliminate the charge/discharge time difference between the input capacitor 18 and the output capacitor 19.

This configuration enables the switched capacitor amplifier to operate so as to eliminate the charge/discharge time difference between the input capacitor 18 and the output capacitor 19. Accordingly, in the shift from the hold state to the sample state, for example, even if one terminal voltage V2 of the output capacitor 19 abruptly increases to the output voltage VOUT, another terminal voltage Vs of the output capacitor 19 does not increase abruptly. In other words, the input voltage to the internal amplifier 11 does not increase abruptly. Therefore, the output voltage of the internal amplifier 11 becomes stable and accordingly the output voltage VOUT becomes stable as well.

Besides, although the capacitor 18 has a larger capacitance than the capacitor 19, the size of the input switch 12 does not need to be increased to deal with the magnitude of the capacitance of the capacitor 18, and hence there is less influence of noise due to the input switch 12 on the internal amplifier 11.

What is claimed is:

1. A switched capacitor amplifier, comprising:
an input capacitor;
an input switch between an input terminal of the switched capacitor amplifier and the input capacitor;
a first reference voltage switch coupled to the input capacitor;
an output capacitor having a capacitance smaller than a capacitance of the input capacitor;
an output switch between the output capacitor and an output terminal of the switched capacitor amplifier;
an internal amplifier that amplifies an input voltage at a capacitance ratio between the input capacitor and the output capacitor, to generate an output voltage;
a storage capacitor that stores charges based on the output voltage; and
a control circuit that generates a first clock signal that controls the first reference voltage switch, a second clock signal that controls the input switch and a third clock signal that controls the output switch, such that during sampling, the reference voltage switch is OFF, the input switch is ON, and the output switch is turned ON following a predetermined time period after the input switch is turned ON.

2. A switched capacitor amplifier according to claim 1, further comprising a second reference voltage switch, a third reference voltage switch, and a fourth reference voltage switch,
wherein the input switch and the input capacitor reside in order between the input terminal of the switched capacitor amplifier and an inverting input terminal of the internal amplifier,
wherein the first reference voltage switch resides between a connection point between the input switch and the input capacitor, and a reference voltage input terminal,
wherein the third reference voltage switch and the storage capacitor reside in order between the inverting input terminal of the internal amplifier and an output terminal of the internal amplifier,
wherein the fourth reference voltage switch resides between a connection point between the third reference voltage switch and the storage capacitor, and the reference voltage input terminal,
wherein the output capacitor and the output switch are reside in order between the inverting input terminal of the internal amplifier and the output terminal of the internal amplifier,
wherein the second reference voltage switch resides between a connection point between the output capacitor and the output switch, and the reference voltage input terminal, and
wherein a non-inverting input terminal of the internal amplifier is connected to the reference voltage input terminal, and the output terminal of the internal amplifier is connected to the output terminal of the switched capacitor amplifier.

3. A switched capacitor amplifier according to claim 1, wherein a charge time and a discharge time of the input capacitor and the output capacitor are substantially the same.

* * * * *